(12) United States Patent
Koizumi et al.

(10) Patent No.: US 10,379,284 B2
(45) Date of Patent: Aug. 13, 2019

(54) LIGHT SOURCE DEVICE AND PROJECTOR

(71) Applicant: SEIKO EPSON CORPORATION, Tokyo (JP)

(72) Inventors: Ryuta Koizumi, Shiojiri (JP); Toshiaki Hashizume, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 2 days.

(21) Appl. No.: 15/919,458

(22) Filed: Mar. 13, 2018

(65) Prior Publication Data

US 2018/0284340 A1  Oct. 4, 2018

(30) Foreign Application Priority Data

Mar. 29, 2017 (JP) ................... 2017-064535

(51) Int. Cl.
  *F21V 8/00* (2006.01)
  *H01L 33/50* (2010.01)
  *H01S 5/00* (2006.01)
  *H01S 5/022* (2006.01)
  *H01S 5/323* (2006.01)
  (Continued)

(52) U.S. Cl.
  CPC ......... *G02B 6/0073* (2013.01); *G02B 6/0003* (2013.01); *G02B 6/0068* (2013.01); *G03B 21/16* (2013.01); *G03B 21/204* (2013.01); *H01L 33/505* (2013.01); *H01S 5/02208* (2013.01); *H01S 5/02292* (2013.01); *H04N 9/3105* (2013.01); *H04N 9/3144* (2013.01); *H04N 9/3155* (2013.01); *H04N 9/3158* (2013.01); *H04N 9/3164* (2013.01);
  (Continued)

(58) Field of Classification Search
  CPC .. G02B 6/0003; G02B 6/0068; G02B 6/0073; G03B 21/204; H01S 5/005; H04N 9/3164
  USPC .......................................................... 257/98
  See application file for complete search history.

(56) References Cited

U.S. PATENT DOCUMENTS 7,982,229 B2   7/2011  Bechtel et al.
8,157,428 B2 * 4/2012  Stenton ............... G02B 6/0008
                                                        362/553
(Continued)

FOREIGN PATENT DOCUMENTS

JP  2007-311357 A  11/2007
JP  2010-251686 A  11/2010
JP  2016-018010 A   2/2016

*Primary Examiner* — Victoria K. Hall
(74) *Attorney, Agent, or Firm* — Oliff PLC (57) ABSTRACT

A light source device includes a first light source configured to emit excitation light having a first wavelength band, a wavelength conversion member having a plurality of surfaces and configured to convert the excitation light made incident from the first light source into converted light having a second wavelength band different from the first wavelength band, and a first light transmissive member provided between the first light source and the wavelength conversion member and configured to transmit the excitation light. The wavelength conversion member includes a first surface on which the excitation light from the first light source is made incident. The first light transmissive member includes, on a surface opposed to the first surface of the wavelength conversion member, a first reflection layer that transmits the excitation light and reflects the converted light. A gap is provided between the first surface and the first reflection layer.

18 Claims, 5 Drawing Sheets

(51) Int. Cl.
*H04N 9/31* (2006.01)
*G03B 21/20* (2006.01)
*G03B 21/16* (2006.01)

(52) U.S. Cl.
CPC ............. *H01L 33/507* (2013.01); *H01S 5/005* (2013.01); *H01S 5/32341* (2013.01)

(56) References Cited

U.S. PATENT DOCUMENTS

| | | | | |
|---|---|---|---|---|
| 8,858,025 B2* | 10/2014 | Park | ........................ | F21S 43/33 |
| | | | | 362/248 |
| 9,086,209 B2* | 7/2015 | Park | ........................ | F21S 43/15 |
| 9,228,714 B2* | 1/2016 | Park | ........................ | F21V 7/00 |
| 9,312,458 B2* | 4/2016 | Park | ........................ | H01L 33/60 |
| 9,627,595 B2* | 4/2017 | Park | ........................ | H01L 33/58 |
| 10,261,402 B2* | 4/2019 | Koizumi | .............. | G03B 21/204 |
| 2003/0099267 A1* | 5/2003 | Hennig | .................. | H01S 5/4025 |
| | | | | 372/36 |
| 2003/0147055 A1 | 8/2003 | Yokoyama | | |
| 2008/0074898 A1* | 3/2008 | Sommer | ............... | G02B 6/0026 |
| | | | | 362/583 |
| 2008/0123064 A1* | 5/2008 | Takagi | .................. | G02B 27/104 |
| | | | | 353/122 |
| 2010/0246159 A1 | 9/2010 | Wada | | |
| 2011/0096569 A1* | 4/2011 | Hamada | ............... | G02B 6/0085 |
| | | | | 362/613 |
| 2012/0140436 A1* | 6/2012 | Yang | ........................ | F21V 13/02 |
| | | | | 362/84 |
| 2012/0182762 A1* | 7/2012 | Hu | ........................ | G02B 6/0023 |
| | | | | 362/606 |
| 2014/0126241 A1* | 5/2014 | Hu | ........................ | G02B 6/003 |
| | | | | 362/610 |
| 2017/0082896 A1* | 3/2017 | Jang | ........................ | H01L 33/507 |
| 2019/0018184 A1* | 1/2019 | Miyashita | ............ | G02B 6/0073 |
| 2019/0056546 A1* | 2/2019 | Vrehen | ................. | G02B 6/003 |

* cited by examiner

FIG. 8

LIGHT SOURCE DEVICE AND PROJECTOR

BACKGROUND

1. Technical Field

The present invention relates to a light source device and a projector.

2. Related Art

In recent years, there has been an illumination device in which a solid-state light source such as a semiconductor laser and a phosphor layer (a wavelength conversion member) are combined to use, as illumination light, fluorescent light obtained by converting light emitted from the solid-state light source (see, for example, JP-A-2016-18010 (Patent Literature 1)).

Incidentally, when high-luminance and high-power light is used as excitation light in order to achieve improvement of luminance in the illumination device, fluorescent light conversion efficiency is deteriorated because the temperature of the phosphor layer rises. On the other hand, it is also conceivable to increase the diameter of a spot by the excitation light formed on the surface of the phosphor layer and reduce the optical density of the excitation light. However, when the spot diameter is increased, the area of the fluorescent emitted light in the phosphor layer increases. The fluorescent light cannot be efficiently taken into an optical system at a post stage.

In order to solve the problem, there has been known a technique for separating a plane of incidence on the phosphor layer in the excitation light and a plane of emission of the fluorescent light to reduce the area of the fluorescent emitted light (see, for example, U.S. Pat. No. 7,982,229 (patent Literature 2)).

However, when the plane of incidence of the excitation light and the plane of emission of the fluorescent light are separated as explained above, a light leak occurs in the phosphor layer. Therefore, it is likely that a new problem of deterioration in light use efficiency is caused.

SUMMARY

An advantage of some aspects of the invention is to provide a light source device having high light use efficiency. Another object of the invention is to provide a projector including the light source device.

According to an aspect of the invention, a light source device is provided. The light source device includes: a first light source configured to emit excitation light having a first wavelength band; a wavelength conversion member having a plurality of surfaces and configured to convert the excitation light made incident from the first light source into converted light having a second wavelength band different from the first wavelength band; and a first light transmissive member provided between the first light source and the wavelength conversion member and configured to transmit the excitation light. The wavelength conversion member includes: a first surface on which the excitation light from the first light source is made incident; a second surface opposed to the first surface; and a third surface that emits the converted light. The first light transmissive member includes, on a surface opposed to the first surface of the wavelength conversion member, a first reflection layer that transmits the excitation light and reflects the converted light. A gap is provided between the first surface and the first reflection layer.

In the light source device according to the first aspect, since light propagated in the wavelength conversion member is totally reflected by the gap provided between the first surface and the first reflection layer, it is possible to reduce an amount of light made incident on the first reflection layer. Therefore, it is possible to reduce a loss due to the first reflection layer to increase an amount of light reaching the third surface. Therefore, since the converted light is not emitted to the outside of the wavelength conversion member as leak light and is efficiently emitted from the third surface, it is possible to realize high light use efficiency.

In the first aspect, it is preferable that the light source device further includes: a second light source configured to emit the excitation light having the first wavelength band; and a second light transmissive member provided between the second light source and the wavelength conversion member and configured to transmit the excitation light, the excitation light from the second light source is made incident on the second surface, the second light transmissive member includes, on a surface opposed to the second surface of the wavelength conversion member, a second reflection layer that transmits the excitation light and reflects the converted light, and a gap is provided between the second surface and the second reflection layer.

With this configuration, since the converted light propagated in the wavelength conversion member is reflected by the gap provided between the second surface and the second reflection layer, it is possible to reduce a loss due to the second reflection layer and efficiently emit the converted light from the third surface. Therefore, it is possible to realize high light use efficiency.

In the first aspect, it is preferable that a first cooling member is provided, via a third reflection layer that reflects the converted light, on a fourth surface crossing the first surface and the third surface, and a low-refractive index layer having a second refractive index smaller than a first refractive index of the wavelength conversion member is provided between the fourth surface and the third reflection layer.

With this configuration, since the light propagated in the wavelength conversion member is totally reflected on an interface with the low-refractive index layer, it is possible to reduce an amount of light made incident on the third reflection layer. Therefore, it is possible to reduce a loss due to the third reflection layer to increase an amount of light reaching the third surface. It is possible to discharge heat of a wavelength converting section with the first cooling member.

In the first aspect, it is preferable that a second cooling member is provided, via a fourth reflection layer that reflects the converted light, on a fifth surface crossing the first surface and the third surface and opposed to the fourth surface, and the low-refractive index layer is provided between the fifth surface and the fourth reflection layer.

With this configuration, since the light propagated in the wavelength conversion member is totally reflected on the interface with the low-refractive index layer, it is possible to reduce an amount of light made incident on the fourth reflection layer. Therefore, it is possible to reduce a loss due to the fourth reflection layer to increase an amount of light reaching the third surface. It is possible to discharge heat of the wavelength converting section with the second cooling member.

In the first aspect, it is preferable that the first cooling member and the second cooling member are connected by the first light transmissive member and the second light transmissive member.

With this configuration, it is possible to discharge heat of the first and second light transmissive members. Therefore, it is possible to prevent occurrence of deficiencies due to a temperature rise of the first and second light transmissive members.

In the first aspect, it is preferable that, when the first refractive index is represented as N1 and the second refractive index is represented as N2, N2/N1 is smaller than 0.85.

With this configuration, a ratio of light totally reflected on the interface between the low-refractive index layer and the phosphor is 50% or more. Consequently, in light propagated in the phosphor, an amount of light totally reflected on the low-refractive index layer is larger than an amount of light reflected on the first reflection layer. Therefore, even if a scattering loss on the first reflection layer is taken into account, it is possible to increase an amount of light reaching the third surface.

In the first aspect, it is preferable that a fifth reflection layer of metal that reflects the converted light is provided on the second surface.

With this configuration, it is possible to efficiently extract the converted light from the third surface by reflecting the converted light with the fifth reflection layer.

In the first aspect, it is preferable that the first wavelength band is a wavelength of 430 nm to 480 nm, and the second wavelength band is a wavelength of 500 nm to 700 nm.

With this configuration, it is possible to generate yellow fluorescent light as the converted light by converting blue light serving as the excitation light with the wavelength conversion member.

In the first aspect, it is preferable that the wavelength conversion member has a taper shape in which at least one of the first surface and the second surface tilts to be further away from a center axis perpendicular to the third surface toward the third surface side.

With this configuration, an incident angle on the first surface or the second surface in the converted light propagated in the wavelength conversion member gradually increases toward the third surface side. Therefore, the converted light is satisfactorily propagated in the wavelength conversion member to be efficiently emitted from the third surface.

In the first aspect, it is preferable that a sixth reflection layer that reflects the converted light is provided on a sixth surface side opposed to the third surface.

With this configuration, it is possible to efficiently extract the converted light from the third surface by reflecting the converted light with the sixth reflection layer.

In the first aspect, it is preferable that the light source device includes a gap provided between the sixth reflection layer and the sixth surface.

With this configuration, since the light propagated in the wavelength conversion member is totally reflected on an interface with the gap, it is possible to reduce an amount of light made incident on the sixth reflection layer. Therefore, it is possible to reduce a loss due to the sixth reflection layer to increase an amount of light reaching the third surface.

In the first aspect, it is preferable that an optical member configured to extract the converted light to an outside is provided on the third surface.

With this configuration, it is possible to condense, with the optical member, the converted light extracted from the third surface.

In the first aspect, it is preferable that an inert gas is encapsulated in the gap.

With this configuration, it is possible to house the wavelength conversion member and the first reflection layer in a sealed space. Therefore, it is possible to prevent deterioration due to intrusion of outdoor air from easily occurring.

According to a second aspect of the invention, a projector is provided. The projector includes: the light source device according to the first aspect; a light modulating device configured to modulate, according to image information, light emitted from the light source device; and a projection optical system configured to project the light modulated by the light modulating device.

In the projector according to the second aspect, since the projector includes the light source device having high light use efficiency, it is possible to display a bright and high-quality image.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention are explained in detail below with reference to the drawings.

Note that, in the drawings referred to in the following explanation, characteristic portions are sometimes enlarged and shown for convenience in order to clearly show characteristics. Dimension ratios and the like of components are not always the same as actual dimension ratios and the like.

An example of a projector according to an embodiment is explained. The projector in the embodiment is a projection-type image display device that displays a color video on a screen (a projection surface).

First Embodiment

Figure 1:
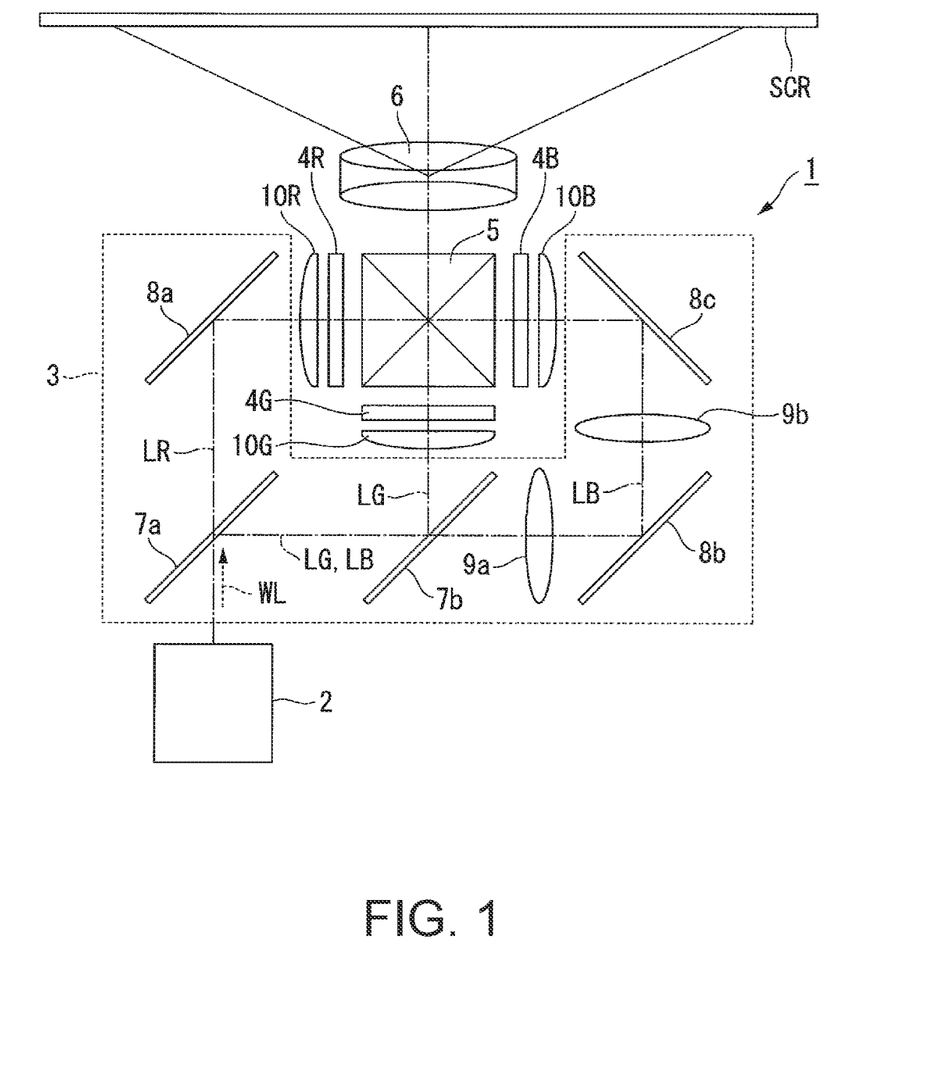
FIG. 1 is a schematic configuration diagram showing a projector according to a first embodiment.

FIG. 1 is a schematic configuration diagram showing a projector according to a first embodiment.

As shown in FIG. 1, a projector 1 according to this embodiment includes an illumination device 2, a color separation optical system 3, a light modulating device 4R, a light modulating device 4G, a light modulating device 4B, a light combination optical system 5, and a projection optical system 6.

The illumination device 2 irradiates white illumination light WL. A specific configuration of the illumination device 2 is explained below.

The color separation optical system 3 separates the illumination light WL irradiated from the illumination device 2 into red light LR, green light LG, and blue light LB. The light modulating device 4R, the light modulating device 4G, and the light modulating device 4B respectively modulate the red light LR, the green light LG, and the blue light LB according to image information and form image light of the respective colors. The light combination optical system 5 combines the image light of the respective colors emitted from the light modulating devices 4R, 4G, and 4B. The projection optical system 6 projects the combined image light emitted from the light combination optical system 5 toward a screen SCR.

The color separation optical system 3 includes a first dichroic mirror 7a, a second dichroic mirror 7b, a first reflection mirror 8a, a second reflection mirror 8b, a third reflection mirror 8c, a first relay lens 9a, and a second relay lens 9b.

The first dichroic mirror 7a separates the illumination light WL emitted from the illumination device 2 into the red light LR, the green light LG, and the blue light LB. That is, the first dichroic mirror 7a has a characteristic of transmitting the red light LR and reflecting the green light LG and the blue light LB.

The second dichroic mirror 7b separates the green light LG and the blue light LB from light in which the green light LG and the blue light LB are mixed. That is, the second dichroic mirror 7b has a characteristic of reflecting the green light LG and transmitting the blue light LB.

The first reflection mirror 8a is disposed in an optical path of the red light LR and reflects the red light LR transmitted through the first dichroic mirror 7a toward the light modulating device 4R. The second reflection mirror 8b and the third reflection mirror 8c are disposed in an optical path of the blue light LB and lead the blue light LB transmitted through the second dichroic mirror 7b to the light modulating device 4B. The second dichroic mirror 7b reflects the green light LG toward the light modulating device 4G.

The first relay lens 9a and the second relay lens 9b are disposed at a post stage of the second dichroic mirror 7b in the optical path of the blue light LB. The first relay lens 9a and the second relay lens 9b compensate for a light loss of the blue light LB that occurs because the optical path length of the blue light LB is larger than the optical path lengths of the red light LR and the green light LG.

The light modulating device 4R, the light modulating device 4G, and the light modulating device 4B are respectively configured from liquid crystal panels. The light modulating device 4R, the light modulating device 4G, and the light modulating device 4B respectively modulate the red light LR, the green light LG, and the blue light LB according to image information and form image light corresponding to the respective colors while allowing the red light LR, the green light LG, and the blue light LB to pass. Polarizing plates (not shown in FIG. 1) are respectively disposed on light incident sides and light emission sides of the light modulating device 4R, the light modulating device 4G, and the light modulating device 4B.

On the light incident sides of the light modulating device 4R, the light modulating device 4G, and the light modulating device 4B, a field lens 10R, a field lens 10G, and a field lens 10B that respectively collimate the red light LR, the green light LG, and the blue light LB respectively made incident on the light modulating device 4R, the light modulating device 4G, and the light modulating device 4B are respectively provided.

The light combination optical system 5 is configured from a cross dichroic prism. The light combination optical system 5 combines the image light of the respective colors respectively emitted from the light modulating device 4R, the light modulating device 4G, and the light modulating device 4B and emits the combined image light toward the projection optical system 6.

The projection optical system 6 is configured from a projection lens group. The projection optical system 6 enlarges the image light combined by the light combination optical system 5 and projects the image light toward the screen SCR. That is, the projection optical system 6 projects the light respectively modulated by the light modulating device 4R, the light modulating device 4G, and the light modulating device 4B on the screen SCR. Consequently, an enlarged color video (image) is displayed on the screen SCR.

Illumination Device

Figure 2:
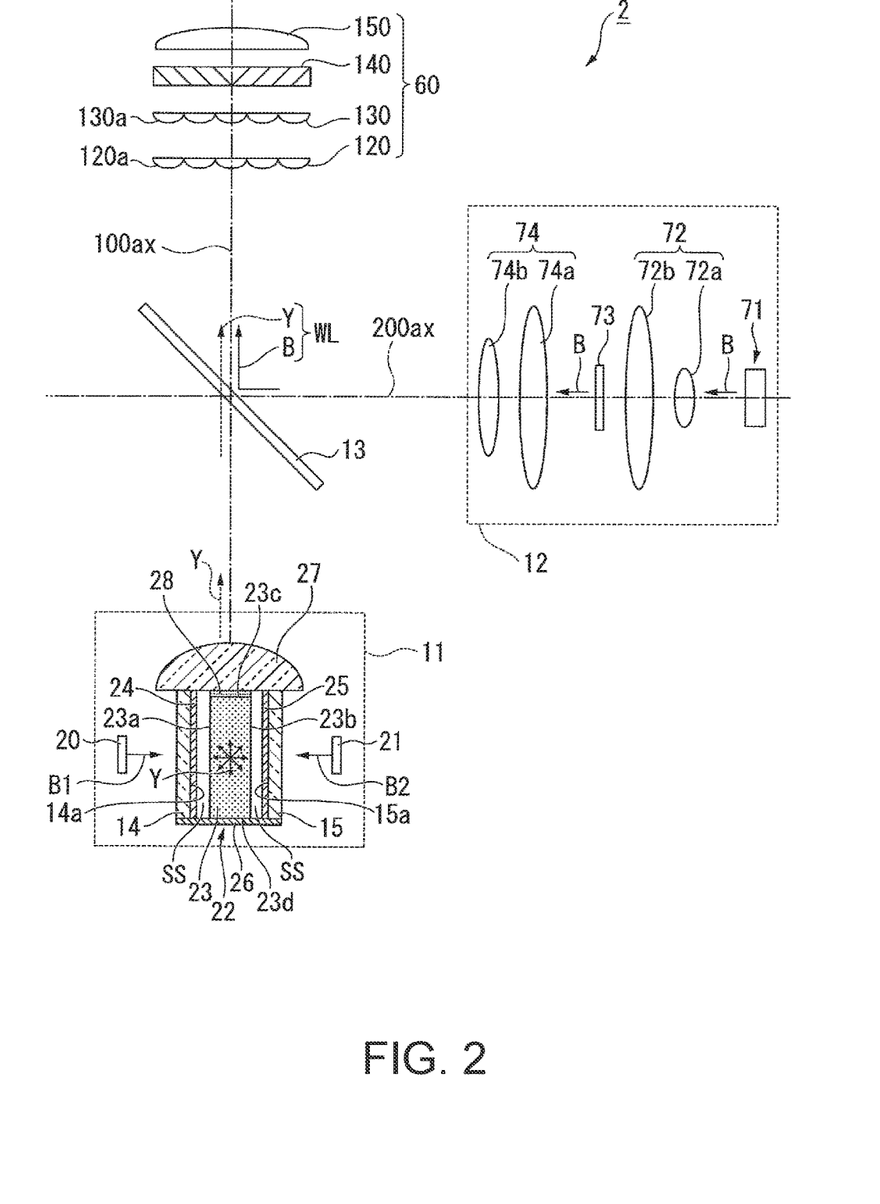
FIG. 2 is a diagram showing a schematic configuration of an illumination device.

The configuration of the illumination device 2 is explained. FIG. 2 is a diagram showing a schematic configuration of the illumination device. As shown in FIG. 2, the illumination device 2 includes a first light source device 11, a second light source device 12, a dichroic mirror 13, and a uniform illumination optical system 60.

In this embodiment, the first light source device 11 includes a first light source 20, a second light source 21, and a wavelength converting section 22.

The first light source 20 is configured from a semiconductor laser that emits excitation light B1 formed by laser light in a first wavelength band. The second light source 21 has the same configuration as the configuration of the first light source 20. That is, the second light source 21 is configured from a semiconductor laser that emits excitation light B2 formed by laser light in the first wavelength band. Light in the first wavelength band is equivalent to, for example, light having a peak of light emission intensity at 430 nm to 480 nm. In this embodiment, light having a peak of light emission intensity at approximately 445 nm is used as the excitation lights B1 and B2.

Note that the first light source 20 or the second light source 21 may be configured by one semiconductor laser or may be configured by a plurality of semiconductor lasers. As the first light source 20 and the second light source 21, a semiconductor laser that emits blue laser light having a wavelength other than 445 nm, for example, having a wavelength of 460 nm can also be used.

As the first light source 20 and the second light source 21, another light source such as a light emitting diode (LED) may be used rather than the semiconductor laser.

In this embodiment, the excitation lights B1 and B2 emitted from the first light source 20 and the second light source 21 are made incident on the wavelength converting section 22. The wavelength converting section 22 converts the excitation lights B1 and B2 into fluorescent light (converted light) Y in a second wavelength band different from the first wavelength band. The light in the second wavelength band is equivalent to, for example, yellow light having a peak of light emission intensity at 520 nm to 580 nm. Note that the second wavelength band can be set in a range of 500 nm to 700 nm as a wavelength band that forms the yellow color.

Figure 3:
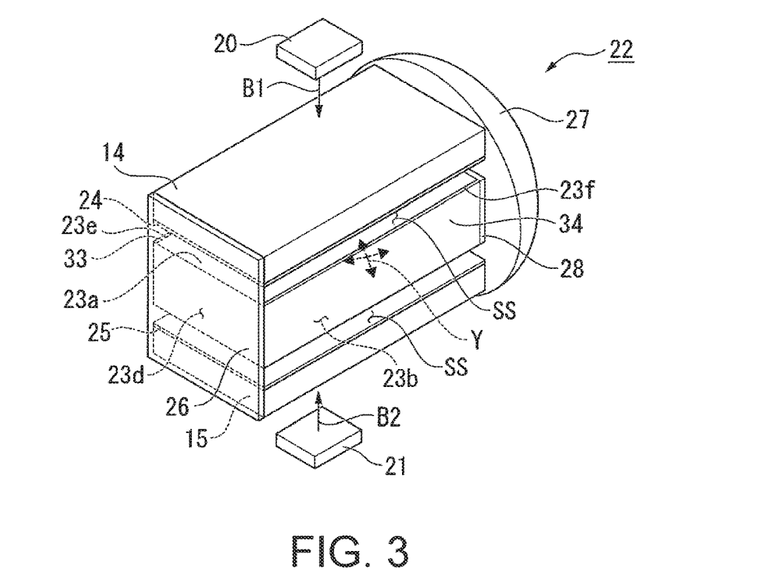
FIG. 3 is a perspective view showing a main part configuration of a wavelength converting section.

FIG. 3 is a perspective view showing a main part configuration of the wavelength converting section 22.

As shown in FIGS. 2 and 3, the wavelength converting section 22 includes a phosphor (a wavelength conversion member) 23, glass plates 14 and 15, reflection layers 24 and 25, a silver mirror 26, a pickup lens (an optical member) 27, and reflection layers 33 and 34. In this embodiment, the phosphor 23 is formed in a flat shape having a plurality of surfaces. The phosphor 23 converts the excitation light B1 made incident from the first light source 20 and the excitation light B2 made incident from the second light source 21 into the fluorescent light (the converted light) Y in the second wavelength band different from the first wavelength band. Specifically, the phosphor 23 is formed by a hexahedron.

The phosphor 23 formed by the hexahedron includes three sets of surfaces opposed to one another. Specifically, the phosphor 23 includes a first surface 23a and a second surface 23b opposed to each other, a third surface 23c and a sixth surface 23d opposed to each other, and a fourth surface 23e and a fifth surface 23f opposed to each other. The fourth surface 23e and the fifth surface 23f cross the first surface 23a and the third surface 23c. Note that, in this embodiment, the phosphor 23 is not limited to the hexahedron. For example, the phosphor 23 may be a decahedron, a cross section of which parallel to a direction in which the excitation light B1 from the first light source 20 and the excitation light B2 from the second light source 21 are made incident on the phosphor 23 is octagonal.

In this embodiment, the phosphor 23 includes phosphor particles (not shown in FIG. 2) that convert the excitation lights B1 and B2 into the fluorescent light Y. As the phosphor particles, for example, a YAG (yttrium/aluminum/garnet)-based phosphor is used. Note that a material forming the phosphor particles may be one kind or may be a mixture of particles formed using two or more kinds of materials. As the phosphor 23, phosphor particles dispersed in an inorganic binder such as alumina or phosphor particles sintered without using a binder are suitably used.

A phosphor having a low light scattering property is used as the phosphor 23 in this embodiment. That is, a phosphor with a small amount of pores functioning as a light scattering member is adopted as the phosphor 23. In this way, it is possible to reduce occurrence of a light loss that occurs because the fluorescent light Y is reflected a plurality of times by the pores in the phosphor 23.

In this embodiment, the first light source 20 is disposed to be opposed to the first surface 23a of the phosphor 23. The second light source 21 is disposed to be opposed to the second surface 23b of the phosphor 23. That is, the excitation light B1 emitted from the first light source 20 is made incident on the first surface 23a. The excitation light B2 emitted from the second light source 21 is made incident on the second surface 23b. The fluorescent light Y converted by the phosphor 23 is emitted from the third surface 23c. In the following explanation, the first surface 23a and the second surface 23b are sometimes referred to as light incident surface and the third surface 23c is sometimes referred to as light emission surface.

In this embodiment, the glass plate 14 is provided between the first light source 20 and the phosphor 23 and transmits the excitation light B1 emitted from the first light source 20. The glass plate 14 is equivalent to a "first light transmissive member" described in the appended claims.

The glass plate 15 is provided between the second light source 21 and the phosphor 23 and transmits the excitation light B2 emitted from the second light source 21. The glass plate 15 is equivalent to a "second light transmissive member" described in the appended claims. Note that a member having a light transmissive property that transmits the excitation light B1 can also be used instead of the glass plates 14 and 15.

In the glass plate 14, the reflection layer 24 is provided on a surface 14a opposed to the first surface 23a of the phosphor 23. In the glass plate 15, the reflection layer 25 is provided on a surface 15a opposed to the second surface 23b of the phosphor 23.

The reflection layer 24 is formed by a dielectric multilayer film that transmits the excitation light B1 and reflects the fluorescent light (the converted light) Y. Similarly, the reflection layer 25 is formed by a dielectric multilayer film that transmits the excitation light B2 and reflects the fluorescent light (the converted light) Y. In this embodiment, the reflection layer 24 is equivalent to a "first reflection layer" described in the appended claims. The reflection layer 25 is equivalent to a "second reflection layer" described in the appended claims.

In this embodiment, since the reflection layers 24 and 25 are formed on the surfaces (the surfaces 14a and 15a) of the glass plates 14 and 15, reflection layers having high flatness can be formed as the reflection layers 24 and 25. Therefore, it is possible to obtain the reflection layers 24 and 25 having high reliability that can obtain desired reflection performance.

In this embodiment, the glass plate 14 and the phosphor 23 are disposed spaced apart from each other. That is, a gap (a space) SS is provided between the first surface 23a of the phosphor 23 and the reflection layer 24 (a first reflection layer). Similarly, the glass plate 15 and the phosphor 23 are disposed spaced apart from each other. That is, the gap (the space) SS is provided between the second surface 23b of the phosphor 23 and the reflection layer 25 (a second reflection layer). In this embodiment, an air layer is present in the gap SS.

The silver mirror 26 is provided on the sixth surface 23d opposed to the third surface 23c. The silver mirror 26 reflects the fluorescent light (the converted light) Y generated in the phosphor 23 toward the third surface 23c side. In this embodiment, the silver mirror 26 is equivalent to a "sixth reflection layer" described in the appended claims. Note that the sixth reflection layer is not limited to the silver mirror 26 and only has to be a reflection layer of metal.

The silver mirror 26 is provided not only on the sixth surface 23d of the phosphor 23 but also on the sixth surface 23d side in the glass plates 14 and 15. The silver mirror 26 closes the sixth surface 23d side of the gap SS. Consequently, it is possible to prevent the fluorescent light Y made incident on the gap SS without being totally reflected on the boundary between the phosphor 23 and the gap SS from leaking from the sixth surface 23d side.

The reflection layer 33 is provided on the fourth surface 23e. The reflection layer 34 is provided on the fifth surface 23f. The reflection layers 33 and 34 reflect the fluorescent light (the converted light) Y generated in the phosphor 23. More specifically, the reflection layers 33 and 34 are made of metal films that reflect the fluorescent light Y. It is possible to satisfactorily propagate the fluorescent light Y in the phosphor 23 by providing such reflection layers 33 and 34.

In this embodiment, the pickup lens 27 is provided on the third surface 23c of the phosphor 23. The pickup lens 27 is stuck to the third surface 23c via an adhesive layer 28. The pickup lens 27 has a function of extracting the fluorescent light (the converted light) Y emitted from the third surface 23c. In this embodiment, the pickup lens 27 is equivalent to an "optical member" in the appended claims. Note that a not-shown optical member such as a lens that collimates the fluorescent light Y extracted by the pickup lens 27 and emitted from the pickup lens 27 is disposed at a post stage of an optical path of the pickup lens 27.

As the adhesive layer 28, it is desirable to use a material having a refractive index equivalent to the refractive index of the phosphor 23 or a refractive index higher than the refractive index of the phosphor 23. The refractive index of the adhesive layer 28 is desirably lower than the refractive index of the pickup lens 27.

Consequently, it is possible to prevent total reflection of the fluorescent light Y on the interface between the phosphor 23 and the adhesive layer 28 and the interface between the adhesive layer 28 and the pickup lens 27. Therefore, it is possible to efficiently extract the fluorescent light Y to the outside of the phosphor 23.

The fluorescent light Y generated in the phosphor has uniform intensity in all spherical directions. Therefore, the fluorescent light Y is made incident on the first surface 23a or the second surface 23b at various angles. In this embodiment, the gap SS is provided between the first surface 23a and the reflection layer 24. The gap SS is provided between the second surface 23b and the reflection layer 25. In this embodiment, the gap SS is configured from an air layer. A refractive index (1.0) of the gap SS is smaller than the refractive index of the phosphor 23.

With the wavelength converting section 22 in this embodiment, it is possible to totally reflect, on the boundary surface between the phosphor 23 and the gap SS, components made incident on the first surface 23a and the second surface 23b in the fluorescent light Y generated in the phosphor 23.

As a comparative example, the reflection layer 24 is directly provided on the first surface 23a and the reflection layer 25 is directly provided on the second surface 23b. Since the reflection layers 24 and 25 are configured from dielectric multilayer films, usually, the reflection layers 24 and 25 have a slight absorption/scattering characteristic of 1% or less. Therefore, a loss occurs every time the fluorescent light Y propagated in the phosphor 23 is reflected on the reflection layers 24 and 25. A loss until the fluorescent light Y reaches the third surface 23c (a light emission surface) increases.

On the other hand, with the wavelength converting section 22 in this embodiment, it is possible to totally reflect, on the boundary surface between the phosphor 23 and the gap SS, components satisfying total reflection conditions in the fluorescent light Y made incident on the first surface 23a and the second surface 23b. Note that a ray having an angle equal to or smaller than a total reflection angle in the fluorescent light Y is transmitted through the gap SS and reflected into the phosphor 23 by the reflection layers 24 and 25. Therefore, the fluorescent light Y is not emitted to the outside of the phosphor 23 as leak light.

Since the fluorescent light Y is totally reflected on the boundary surface between the phosphor 23 and the gap SS in this way, it is possible to reduce an amount of the fluorescent light Y made incident on the reflection layers 24 and 25. Therefore, it is possible to reduce a loss due to absorption and scattering by the reflection layers 24 and 25.

Therefore, with the wavelength converting section 22 in this embodiment, it is possible to efficiently extract the fluorescent light Y from the third surface 23c.

In the phosphor 23 in this embodiment, the area of the light emission surface (the third surface 23c) is smaller than the area of the light incident surfaces (the first surface 23a and the second surface 23b). By setting the incident area of the excitation light B1 and B2 in the phosphor 23 large, it is possible to reduce light density of excitation light on the light incident surface.

Therefore, it is possible to efficiently generate the fluorescent light Y in the phosphor 23. By setting the light emission area (the area of the light emission surface) of the fluorescent light Y small, it is possible to reduce the dichroic mirror 13 and the uniform illumination optical system 60 in size in an optical system at a post stage, that is, in this embodiment.

Note that, in the wavelength converting section 22 in this embodiment, although illustration in FIG. 3 is omitted, on the fourth surface 23e side and the fifth surface 23f side in the gap SS, a reflection layer of a metal film or the like is provided to prevent the excitation light B1 and B2 and the fluorescent light Y from leaking from the gap SS. The gap SS is sealed.

Referring back to FIG. 2, the dichroic mirror 13 is disposed in an optical path leading from the first light source device 11 to the uniform illumination optical system 60 and an optical path leading from the second light source device 12 to the uniform illumination optical system 60 to cross each of an optical axis of the first light source device 11 (equivalent to an illumination optical axis 100ax of the illumination device 2) and an optical axis 200ax of the second light source device 12 at an angle of 45. The dichroic mirror 13 reflects blue light B explained below emitted from the second light source device 12 and transmits the yellow fluorescent light Y emitted from the first light source device 11.

The second light source device 12 includes a light source 71, a condensing optical system 72, a scattering plate 73, and a collimate optical system 74.

The light source 71 is configured from the same semiconductor laser as the first light source 20 of the first light source device 11. The light source 71 may be configured by one semiconductor layer or may be configured by a plurality of semiconductor lasers. The light source 71 may be configured by an LED.

The condensing optical system 72 includes a first lens 72a and a second lens 72b. The condensing optical system 72 condenses the blue light B emitted from the light source 71 on the scattering plate 73 or the vicinity of the scattering plate 73. The first lens 72a and the second lens 72b are configured by convex lenses.

The scattering plate 73 scatters the blue light B emitted from the light source 71 and generates the blue light B having a light distribution close to a light distribution of the fluorescent light Y emitted from the first light source device 11. As the scattering plate 73, a ground glass formed by an optical glass can be used.

The collimate optical system 74 includes a first lens 74a and a second lens 74b. The collimate optical system 74 substantially collimates light emitted from the scattering plate 73. The first lens 74a and the second lens 74b are configured by convex lenses.

The blue light B emitted from the second light source device 12 is reflected by the dichroic mirror 13 and combined with the fluorescent light Y emitted from the first light source device 11 and transmitted through the dichroic mirror 13 to be white illumination light WL. The illumination light WL is made incident on the uniform illumination optical system 60.

The uniform illumination optical system 60 includes a first lens array 120, a second lens array 130, a polarization conversion element 140, and a superimposition lens 150.

The first lens array 120 includes a plurality of first lenses 120a for dividing the illumination light WL into a plurality of partial light beams. The plurality of first lenses 120a are arrayed in a matrix shape in a surface orthogonal to an illumination optical axis 100ax.

The second lens array 130 includes a plurality of second lenses 130a corresponding to the plurality of first lenses 120a of the first lens array 120. The second lens array 130 forms, in conjunction with the superimposition lens 150, images of the first lenses 120a of the first lens array 120 in the vicinities of image forming regions of the light modulating device 4R, the light modulating device 4G, and the light modulating device 4B. The plurality of second lenses 130a are arrayed in a matrix shape in a surface orthogonal to the illumination optical axis 100ax.

The polarization conversion element 140 converts light emitted from the second lens array 130 into linearly polarized light. The polarization conversion element 140 includes, for example, a polarization separation film and a phase difference plate (both of which are not shown in FIG. 3).

The superimposition lens 150 condenses partial light beams emitted from the polarization conversion element 140 and superimposes the partial light beams in the vicinities of the image forming regions of the light modulating device 4R, the light modulating device 4G, and the light modulating device 4B shown in FIG. 1.

Consequently, the illumination device 2 emits the illumination light WL having a substantially uniform illuminance distribution toward the color separation optical system 3.

As explained above, with the first light source device 11 in this embodiment, it is possible to efficiently extract the fluorescent light Y from the phosphor 23. Therefore, it is possible to realize high light use efficiency.

With the illumination device 2 including the first light source device 11, it is possible to generate bright illumination light WL.

Therefore, with the projector 1 in this embodiment, it is possible to display a high-quality image by using the bright illumination light WL.

Second Embodiment

An illumination device according to a second embodiment is explained. A difference between this embodiment and the first embodiment is the configuration of the wavelength converting section in the first light source device. The other components are common to the embodiments. Therefore, in the following explanation, the configuration of the wavelength converting section is mainly explained. Members and components common to the embodiments are denoted by the same reference numerals and signs and detailed explanation of the members and the components is omitted.

Figure 4:
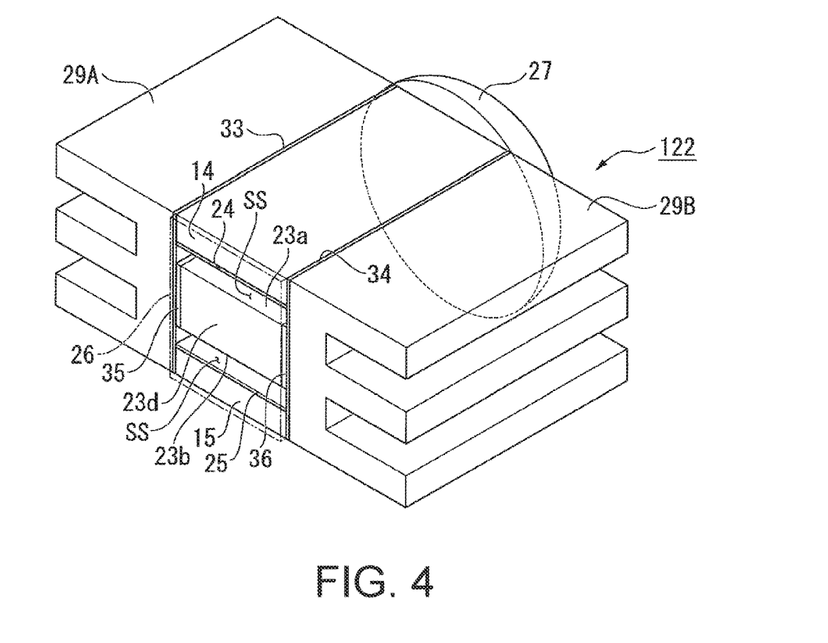
FIG. 4 is a perspective view showing a main part configuration of a wavelength converting section according to a second embodiment.

FIG. 4 is a perspective view showing a main part configuration of a wavelength converting section 122 in this embodiment.

As shown in FIG. 4, the wavelength converting section 122 includes the phosphor 23, the glass plates 14 and 15, the reflection layers 24 and 25, the silver mirror 26, the pickup lens 27, cooling members 29A and 29B, the reflection layers 33 and 34, and low-refractive index layers 35 and 36.

Figure 5:
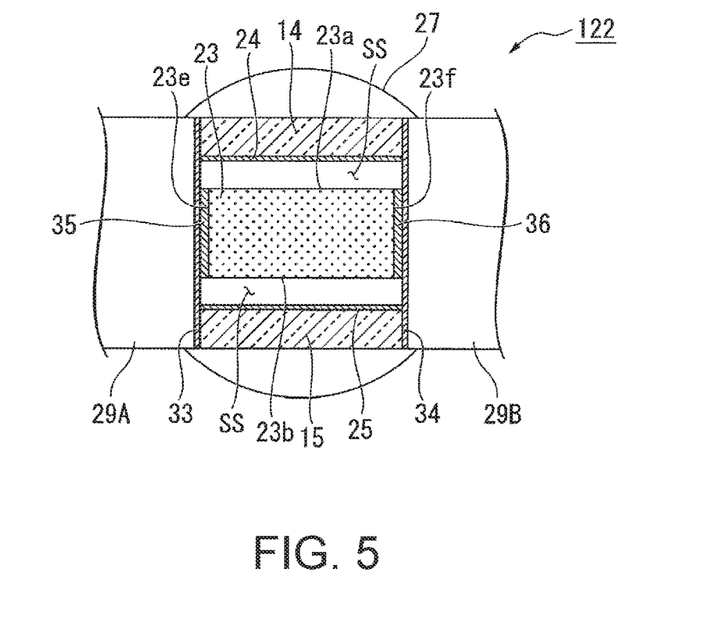
FIG. 5 is a sectional view showing a main part configuration of the wavelength converting section.

FIG. 5 is a sectional view showing a main part configuration of the wavelength converting section 122.

As shown in FIG. 5, the cooling member 29A is provided on the opposite side of the phosphor 23 (the fourth surface 23e) in the reflection layer 33. The cooling member 29B is provided on the opposite side of the phosphor 23 (the fifth surface 23f) in the reflection layer 34. That is, the cooling member 29A is provided on the fourth surface 23e of the phosphor 23 via the reflection layer 33 (a third reflection layer). The cooling member 29B is provided on the fifth surface 23f of the phosphor 23 via the reflection layer 34 (a fourth reflection layer).

The cooling members 29A and 29B are configured from a metallic member such as a heat sink. In this embodiment, the cooling member 29A is equivalent to a "first cooling member" described in the appended claims. The cooling member 29B is equivalent to a "second cooling member" described in the appended claims.

The wavelength converting section 122 in this embodiment can discharge, on the basis of such a configuration, via the cooling members 29A and 29B, heat generated in the phosphor 23 according to the generation of the fluorescent light Y. Therefore, it is possible to prevent deterioration in light emission efficiency of the phosphor 23 due to the heat to efficiently generate the fluorescent light Y.

In this embodiment, the cooling member 29A is connected to the glass plates 14 and 15. Similarly, the cooling member 29B is connected to the glass plates 14 and 15. Specifically, one end side of the glass plates 14 and 15 (the fourth surface 23e side of the phosphor 23) is connected to the cooling member 29A via the reflection layer 33. The other end side of the glass plates 14 and 15 (the fifth surface 23f side of the phosphor 23) is connected to the cooling member 29B via the reflection layer 34.

The wavelength converting section 122 in this embodiment can discharge, on the basis of such a configuration, via the cooling members 29A and 29B, heat generated in the glass plates 14 and 15 according to the incidence of the excitation lights B1 and B2. Therefore, it is possible to prevent occurrence of deficiencies such as damage due to a temperature rise of the glass plates 14 and 15.

Incidentally, for example, in the wavelength converting section 22 in the first embodiment, in the case of a configuration in which the cooling members 29A and 29B explained in this embodiment are attached to the fourth surface 23e and the fifth surface 23f via a metal material such as Al or Ag, such a metal material functions as a reflection film that reflects lights made incident on the fourth surface 23e and the fifth surface 23f.

However, the reflection film configured from the metal material has a slight absorption/scattering characteristic in this way. Therefore, when the fluorescent light Y propagated in the phosphor 23 is multiply reflected by the fourth surface 23e and the fifth surface 23f, it is likely that a loss occurs every time the fluorescent light Y is reflected. The wavelength converting section 122 in this embodiment solves the problem as explained below.

In this embodiment, the low-refractive index layer 35 is provided between the fourth surface 23e of the phosphor 23 and the reflection layer 33. The low-refractive index layer 36 is provided between the fifth surface 23f and the reflection layer 34. In this embodiment, the reflection layer 33 is equivalent to a "third reflection layer" described in the appended claims. The reflection layer 34 is equivalent to a "fourth reflection layer" described in the appended claims.

Note that the low-refractive index layers 35 and 36 are layers having a refractive index (a second refractive index) smaller than the refractive index (the first refractive index) of the phosphor 23. As the low-refractive index layers 35 and 36, for example, glass of $SiO_2$, $MgF_2$, or $CaF_2$ and a thin film of $SiO_2$, $MgF_2$, or $CaF_2$ can be used.

With the wavelength converting section 122 in this embodiment, it is possible to totally reflect, with the low-refractive index layers 35 and 36, components made incident on the fourth surface 23e and the fifth surface 23f in the fluorescent light Y generated in the phosphor 23. Consequently, it is possible to reduce an amount of light directly made incident on the reflection layers 33 and 34. Therefore, it is possible to reduce a loss involved in the reflection on the reflection layers 33 and 34.

The inventor found that, by setting a refractive index ratio of the low-refractive index layers 35 and 36 to the phosphor 23 smaller than 0.85, it is possible to increase a ratio of light totally reflected on the boundaries between the low-refractive index layers 35 and 36 and the phosphor 23.

A refractive index of the phosphor 23 is referred to as first refractive index N1. A refractive index of the low-refractive index layers 35 and 36 is referred to as second refractive index N2.

A reason for setting the refractive index ratio smaller than 0.85 is explained. A total reflection angle θ on the interfaces between the phosphor 23 and the low-refractive index layers 35 and 36 is calculated by sin θ=N2/N1. When 0.85 is substituted as the refractive index ratio (N2/N1), θ is approximately 58.2 degrees. That is, the total reflection angle θ at the time when the refractive index ratio is set to 0.85 is approximately 58.2 degrees.

Therefore, in the fluorescent light Y generated in the phosphor 23, light made incident at an angle equal to or smaller than the total reflection angle (equal to or smaller than 58.2 degrees) is transmitted through the low-refractive index layers 35 and 36 without being totally reflected on the low-refractive index layers 35 and 36.

Figure 6:
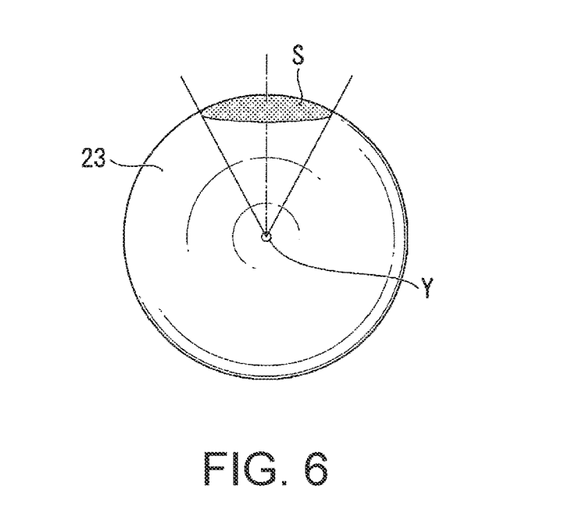
FIG. 6 is a diagram conceptually showing light emission that occurs on the inside of a phosphor.

Subsequently, the inventor calculated a ratio of light transmitted through the low-refractive index layers 35 and 36. FIG. 6 is a diagram conceptually showing light emission that occurs on the inside of the phosphor 23. In FIG. 6, it is assumed that light is emitted in the phosphor 23 spherically at uniform intensity.

As shown in FIG. 6, when the fluorescent light Y inside the phosphor 23 is spherically emitted at uniform intensity, an amount of light beams having angles equal to or smaller than a certain angle θ can be regarded as a ratio of a surface area (a solid angle) of a sphere surrounded by the angle θ. When the radius of the sphere is 1, a surface area S of a portion surrounded by the angle θ is specified by the following Expression (1).

$$S=2\pi(1-\cos\theta) \quad \text{Expression (1)}$$

Light traveling from the phosphor 23 toward the low-refractive index layers 35 and 36 are equivalent to a half of all light (the surface area of a hemisphere). Since the surface area of the sphere is 4π, the surface area of the hemisphere can be represented by 2π. Therefore, in the lights traveling from the phosphor 23 toward the low-refractive index layers 35 and 36, a ratio of lights transmitted through the low-refractive index layers 35 and 36 is specified by the following Expression (2).

$$S/2\pi=1-\cos\theta \quad \text{Expression (2)}$$

When θ=58.2 calculated above is substituted in Expression (2), S/2θ=1−cos θ≈0.473 is obtained. That is, lights of approximately 47.3% are transmitted through the low-refractive index layers 35 and 36. This means that light not transmitted through the low-refractive index layers 35 and 36, that is, totally reflected by the low-refractive index layers 35 and 36 is approximately 52.7%.

Note that, when the refractive index ratio of the low-refractive index layers 35 and 36 to the phosphor 23 is larger than 0.85, the total reflection angle θ also increases. More light is transmitted through the low-refractive index layers 35 and 36. That is, this means that a ratio of the totally reflected light in the boundaries between the phosphor 23 and the low-refractive index layers 35 and 36 is smaller than 52.7%.

It was confirmed that, by setting the refractive index ratio (N2/N1) of the second refractive index N2 to the first refractive index N1 smaller than 0.85 as explained above, it is possible to set the ratio of the light totally reflected on the boundary surfaces between the low-refractive index layers 35 and 36 and the phosphor 23 to 50% or more (specifically, 52.7% or more).

In the wavelength converting section 122 in this embodiment, the refractive index ratio (N2/N1) of the second refractive index N2 to the first refractive index N1 is smaller than 0.85. Therefore, it is possible to set the ratio of the light totally reflected on the boundary surfaces between the low-refractive index layers 35 and 36 and the phosphor 23 to 50% or more.

Consequently, in the light (the fluorescent light Y) propagated in the phosphor 23, an amount of light totally reflected on the boundaries between the phosphor 23 and the low-refractive index layers 35 and 36 is larger than an amount of light reflected on the reflection layers 33 and 34. Therefore, even if a scattering loss in the reflection layers 33 and 34 is taken into account, it is possible to increase an amount of light reaching the third surface 23c (the light emission surface).

As explained above, with the wavelength converting section 122 in this embodiment, in addition to the effects of the wavelength converting section 22 in the first embodiment, it is possible to reduce a loss that occurs in the reflection by the reflection layers 33 and 34. Therefore, since it is possible to efficiently extract the fluorescent light Y from the phosphor 23, it is possible to realize higher light use efficiency.

The invention is not limited to the contents of the embodiments and can be changed as appropriate without departing from the spirit of the invention.

For example, in the embodiments, the example is explained in which the air layer is provided in the gap SS. However, an inert gas (e.g., hydrogen or helium) may be encapsulated in the gap SS. Consequently, it is possible to house the phosphor 23, the reflection layers 24 and 25, and the like in a sealed space sealed by the glass plates 14 and 15, the silver mirror 26, the pickup lens 27, and the cooling members 29A and 29B. Therefore, deterioration due to intrusion of the outdoor air less easily occurs.

In the first embodiment, the example is explained in which the excitation light B1 is made incident on the first surface 23a of the phosphor 23 and the excitation light B2 is made incident on the second surface 23b. However, the excitation light B1 may be made incident on only the first surface 23a side of the phosphor 23. In this case, the second light source 21 is unnecessary. A not-shown reflection mirror (a fifth reflection layer) of metal that reflects the excitation light B1 and the fluorescent light Y only has to be provided on the second surface 23b instead of the reflection layer 25 (the second reflection layer).

In the first and second embodiments, the example is explained in which the silver mirror 26 is directly attached on the sixth surface 23d of the phosphor 23. However, the invention is not limited to this. Since the silver mirror 26 has a slight absorption/scattering characteristic, when the fluorescent light Y generated in the phosphor 23 is directly reflected by the silver mirror 26, it is likely that a loss occurs every time the fluorescent light Y is reflected.

Figure 7:
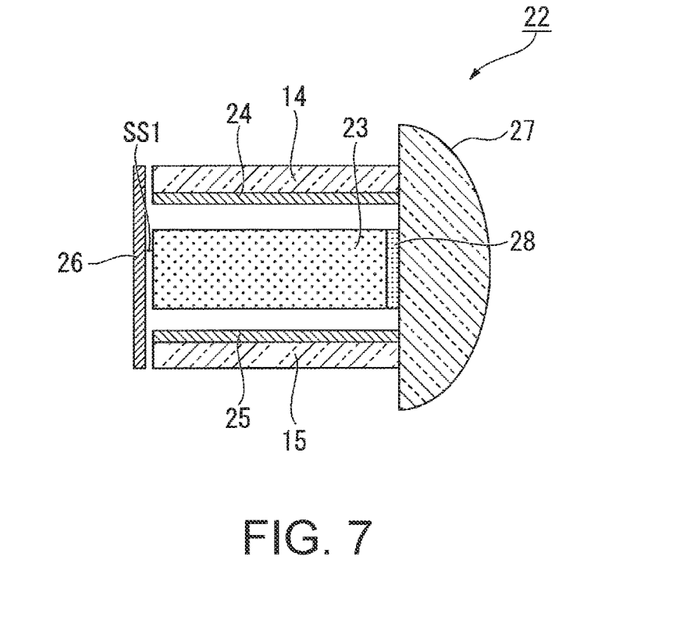
FIG. 7 is a diagram showing a phosphor according to a modification.

On the other hand, as shown in FIG. 7, a gap SS1 may be provided between the silver mirror 26 functioning as the sixth reflection layer and the sixth surface 23*d*. Note that the silver mirror 26 is fixed to, for example, a housing section of the first light source device 11 in a not-shown region. Since the gap SS1 is an air layer, a refractive index is 1.0. Therefore, rays having reflection angles equal to or smaller than the total reflection angle in light made incident on the gap SS1 from the phosphor 23 are totally reflected on the interface between the phosphor 23 and the gap SS1 (the air layer).

With this configuration, since the light (the fluorescent light Y) propagated in the phosphor 23 is totally reflected on the interface with the gap SS1, it is possible to reduce an amount of light made incident on the silver mirror 26. Therefore, it is possible to increase an amount of light reaching the third surface 23*c* (the light emission surface) by reducing a loss due to the silver mirror 26.

In the first and second embodiments, the phosphor formed in the flat shape having the plurality of surfaces is explained as the example of the phosphor 23. However, the invention is not limited to this.

Figure 8:
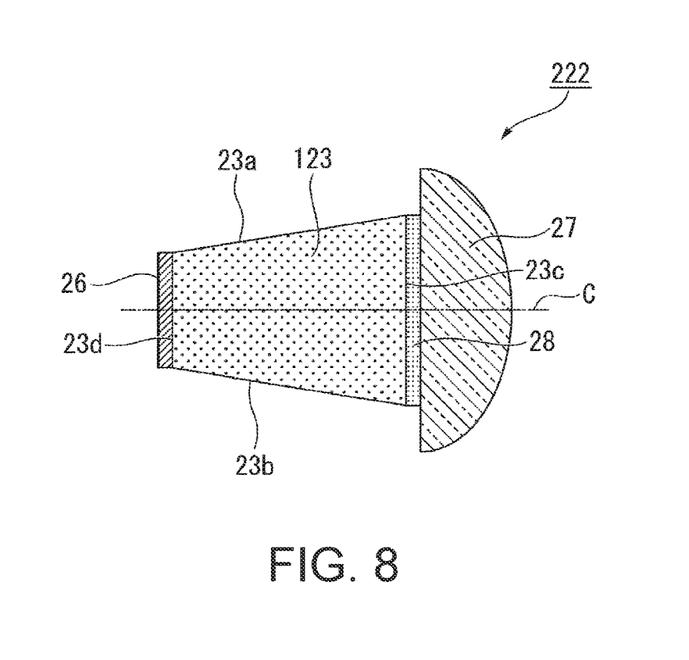
FIG. 8 is a sectional view showing a shape of the phosphor according to the modification.

For example, like a phosphor 123 in a wavelength converting section 222 shown in FIG. 8, a phosphor may have a taper shape in which the first surface 23*a* and the second surface 23*b* tilt to be further away from a center axis C perpendicular to the third surface 23*c* toward the third surface 23*c* side.

With the phosphor 123 formed in such a taper shape, an incident angle on the first surface 23*a* and an incident angle on the second surface 23*b* in the fluorescent light Y propagated in the phosphor 123 gradually increase toward the third surface 23*c* side. Therefore, the fluorescent light Y is satisfactorily propagated in the phosphor 123 to be efficiently emitted from the third surface 23*c*.

On the other hand, when a reverse taper shape in which the first surface 23*a* and the second surface 23*b* tilt to approach the center axis C perpendicular to the third surface 23*c* toward the third surface 23*c* side is adopted, the incident angle of the fluorescent light Y on the first surface 23*a* and the incident angle of the fluorescent light Y on the second surface 23*b* decrease toward the third surface 23*c* side. Before long, light perpendicularly made incident on the first surface 23*a* and light perpendicularly made incident on the second surface 23*b* appear.

The light perpendicularly made incident on the first surface 23*a* and the light perpendicularly made incident on the second surface 23*b* are not further propagated to the third surface 23*c* side and are confined in the phosphor 23. Therefore, the fluorescent light Y cannot be efficiently extracted from the third surface 23*c*.

Note that, in FIG. 8, the example is shown in which both of the first surface 23*a* and the second surface 23*b* tilt to be further away from the center axis C perpendicular to the third surface 23*c* toward the third surface 23*c* side. However, a shape in which only one of the first surface 23*a* and the second surface 23*b* tilts to be further away from the center axis C may be adopted. That is, the phosphor 123 has a taper shape in which at least one of the first surface 23*a* and the second surface 23*b* tilts to be further away from the center axis perpendicular to the third surface 23*c* toward the third surface 23*c* side.

In the embodiments, the projector 1 including the three light modulating devices 4R, 4G, and 4B is illustrated. However, it is also possible to apply the invention to a projector that displays a color video with one light modulating device. A digital mirror device may be used as the light modulating device.

In the embodiments, the example is explained in which the illumination device according to the invention is mounted on the projector. However, the invention is not limited to this. The illumination device according to the invention can also be applied to a lighting fixture, a headlight of an automobile, and the like.

The entire disclosure of Japanese Patent Application No. 2017-064535, filed on Mar. 29, 2017 is expressly incorporated by reference herein.

What is claimed is:

1. A light source device comprising:
   a first light source configured to emit excitation light having a first wavelength band;
   a wavelength conversion member having a plurality of surfaces and configured to convert the excitation light made incident from the first light source into converted light having a second wavelength band different from the first wavelength band; and
   a first light transmissive member provided between the first light source and the wavelength conversion member and configured to transmit the excitation light, wherein
   the wavelength conversion member includes:
      a first surface on which the excitation light from the first light source is made incident;
      a second surface opposed to the first surface; and
      a third surface that emits the converted light,
   the first light transmissive member includes, on a surface opposed to the first surface of the wavelength conversion member, a first reflection layer that transmits the excitation light and reflects the converted light, and
   a gap is provided between the first surface and the first reflection layer.

2. The light source device according to claim 1, further comprising:
   a second light source configured to emit the excitation light having the first wavelength band; and
   a second light transmissive member provided between the second light source and the wavelength conversion member and configured to transmit the excitation light, wherein
   the excitation light from the second light source is made incident on the second surface,
   the second light transmissive member includes, on a surface opposed to the second surface of the wavelength conversion member, a second reflection layer that transmits the excitation light and reflects the converted light, and
   a gap is provided between the second surface and the second reflection layer.

3. The light source device according to claim 2, wherein a first cooling member is provided, via a third reflection layer that reflects the converted light, on a fourth surface crossing the first surface and the third surface, and
   a low-refractive index layer having a second refractive index smaller than a first refractive index of the wavelength conversion member is provided between the fourth surface and the third reflection layer.

4. The light source device according to claim 3, wherein a second cooling member is provided, via a fourth reflection layer that reflects the converted light, on a fifth surface crossing the first surface and the third surface and opposed to the fourth surface, and the low-refractive index layer is provided between the fifth surface and the fourth reflection layer.

5. The light source device according to claim 4, wherein the first cooling member and the second cooling member are connected by the first light transmissive member and the second light transmissive member.

6. The light source device according to claim 3, wherein, when the first refractive index is represented as N1 and the second refractive index is represented as N2, N2/N1 is smaller than 0.85.

7. The light source device according to claim 1, wherein
a first cooling member is provided, via a third reflection layer that reflects the converted light, on a fourth surface crossing the first surface and the third surface, and
a low-refractive index layer having a second refractive index smaller than a first refractive index of the wavelength conversion member is provided between the fourth surface and the third reflection layer.

8. The light source device according to claim 7, wherein
a second cooling member is provided, via a fourth reflection layer that reflects the converted light, on a fifth surface crossing the first surface and the third surface and opposed to the fourth surface, and
the low-refractive index layer is provided between the fifth surface and the fourth reflection layer.

9. The light source device according to claim 8, wherein the first cooling member and the second cooling member are connected by the first light transmissive member and the second light transmissive member.

10. The light source device according to claim 7, wherein, when the first refractive index is represented as N1 and the second refractive index is represented as N2, N2/N1 is smaller than 0.85.

11. The light source device according to claim 1, wherein a fifth reflection layer of metal that reflects the converted light is provided opposed to the second surface.

12. The light source device according to claim 1, wherein the first wavelength band is a wavelength of 430 nm to 480 nm, and the second wavelength band is a wavelength of 500 nm to 700 nm.

13. The light source device according to claim 1, wherein the wavelength conversion member has a taper shape in which at least one of the first surface and the second surface tilts to be further away from a center axis perpendicular to the third surface toward a third surface side.

14. The light source device according to claim 1, wherein a sixth reflection layer that reflects the converted light is provided on a sixth surface side opposed to the third surface.

15. The light source device according to claim 14, wherein a gap is provided between the sixth reflection layer and the sixth surface.

16. The light source device according to claim 1, wherein an optical member configured to extract the converted light to an outside is provided on the third surface.

17. The light source device according to claim 1, wherein an inert gas is encapsulated in the gap.

18. A projector comprising:
the light source device according to claim 1;
a light modulating device configured to modulate, according to image information, light emitted from the light source device; and
a projection optical system configured to project the light modulated by the light modulating device.

* * * * *